United States Patent
Wong et al.

(10) Patent No.: US 10,862,007 B1
(45) Date of Patent: Dec. 8, 2020

(54) ADHESIVE LAYER WITH VARIED MATERIAL PROPERTIES

(71) Applicant: Lumileds Holding B.V., Schipol (NL)

(72) Inventors: Vernon Wong, Mountain View, CA (US); Ken Shimizu, Sunnyvale, CA (US); Daniel B. Roitman, Menlo Park, CA (US)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 16/457,091

(22) Filed: Jun. 28, 2019

(51) Int. Cl.
| | |
|---|---|
| *F21V 3/00* | (2015.01) |
| *F21V 5/00* | (2018.01) |
| *H01L 33/50* | (2010.01) |
| *F21S 41/143* | (2018.01) |
| *H01L 33/58* | (2010.01) |
| *H01L 33/60* | (2010.01) |
| *H01L 33/64* | (2010.01) |
| *C09J 183/04* | (2006.01) |
| *C09J 9/00* | (2006.01) |
| *C08G 77/00* | (2006.01) |

(52) U.S. Cl.
CPC .............. *H01L 33/501* (2013.01); *C09J 9/00* (2013.01); *C09J 183/04* (2013.01); *F21S 41/143* (2018.01); *H01L 33/58* (2013.01); *H01L 33/60* (2013.01); *H01L 33/641* (2013.01); *C08G 77/70* (2013.01); *C08G 77/80* (2013.01); *H01L 2933/0041* (2013.01); *H01L 2933/0058* (2013.01); *H01L 2933/0075* (2013.01)

(58) Field of Classification Search
CPC .. C08G 77/70; C08G 77/80; C09J 9/00; C09J 183/04; F21S 41/143; H01L 33/501–641
USPC ................. 362/249.02, 311.02, 800
See application file for complete search history.

(56) References Cited

U.S. PATENT DOCUMENTS

| | | |
|---|---|---|
| 2018/0123001 A1 | 5/2018 | Hung et al. |
| 2019/0189879 A1 | 6/2019 | Tandon et al. |

FOREIGN PATENT DOCUMENTS

| | | |
|---|---|---|
| KR | 2015-0103590 A | 9/2015 |
| WO | 2017023502 | 2/2017 |

OTHER PUBLICATIONS

"European Application Serial No. 19205643.0, Partial European Search Report dated May 19, 2020", 16 pgs.
"International Application Serial No. PCT/US2020/038497, International Search Report dated Sep. 28, 2020", 6 pgs.
"International Application Serial. No. PCT/US2020/038497, Written Opinion dated Sep. 28, 2020", 9 pgs.

*Primary Examiner* — Jason M Han
(74) *Attorney, Agent, or Firm* — Schwegman Lundberg & Woessner, P.A.

(57) ABSTRACT

A light emitting package and method of making the package are described. The package contains an LED bonded to a light converting layer using an adhesive. The adhesive is jet printed, mask sprayed or extruded onto one of the surfaces before bonding. The adhesive has materials in different sections that differ in refractive index, oxygen permeability, and/or heat conductivity. The materials are formed in concentric rings around the adhesive center, islands or lines and are disposed to provide optical lensing or increasing permeability/heat conductivity with decreasing distance from the center. A substantially-reflective optical side coat surrounds the LED, adhesive layer and connecting structure.

19 Claims, 8 Drawing Sheets

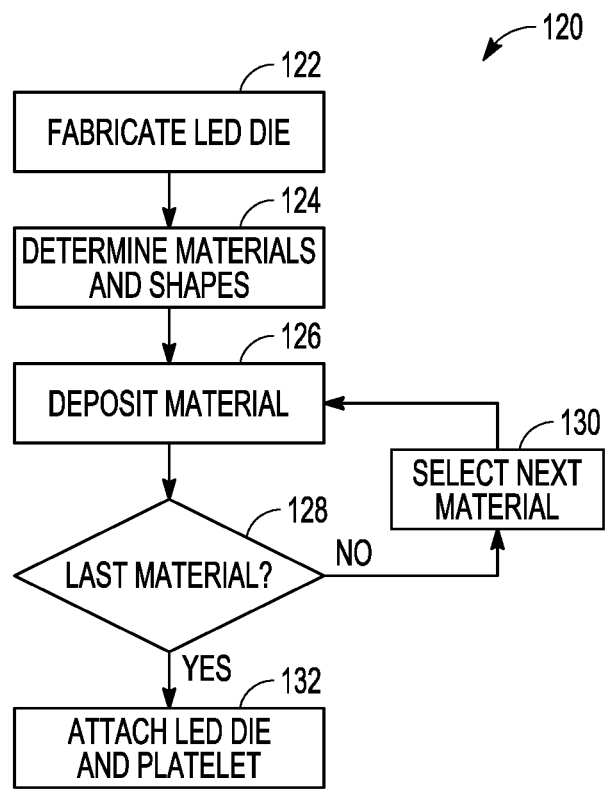
FIG. 1C
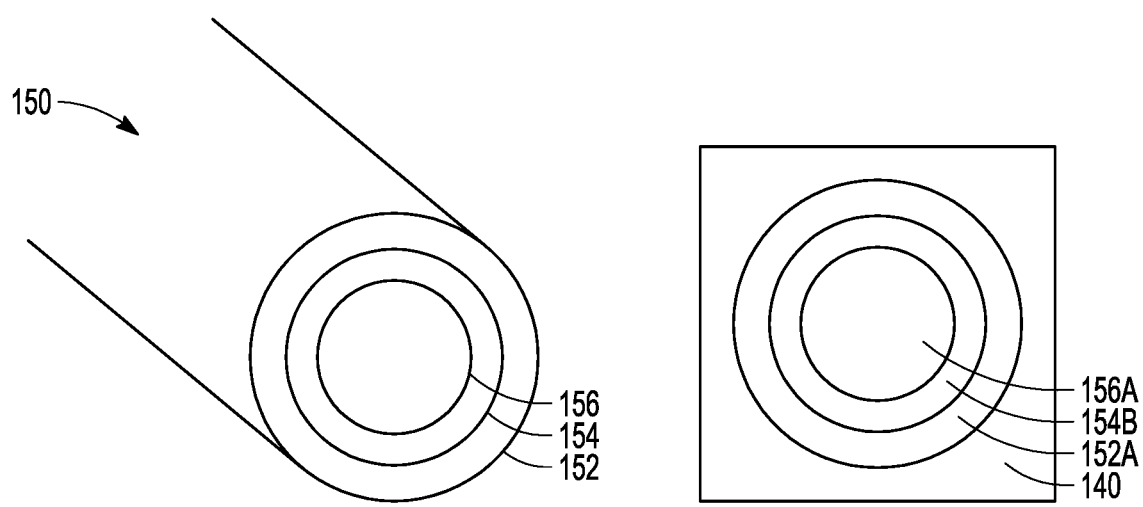
FIG. 1D
FIG. 1E

ADHESIVE LAYER WITH VARIED MATERIAL PROPERTIES

TECHNICAL FIELD

This application relates to light emitting structures. Some embodiments relate to light emitting diode (LED) structures bonded using an adhesive. Some embodiments relate to an adhesive with varied material properties used in bonding of LED structures.

BACKGROUND

Light emitting devices such as LEDs and semiconductor lasers are increasingly being used as light sources in various applications. Purchases of LEDs, for example, has increased over the last 5 years from a relatively small proportion of residential lighting sales to almost 75% of such sales, in addition to other applications, such as in vehicles. The main functional part of an LED may be a semiconductor structure that includes a light-emitting active layer and injecting layers of opposite conductivity types (p-type and n-type) sandwiching the light-emitting active layer. Carriers from the injecting layers may be injected into the light-emitting active layer, where they may recombine to generate radiation of a desired wavelength. The semiconductor structure may be incorporated in a package that provides electrical connections between the semiconductor structure and external devices. The package may also provide protection against the environment, which may include thermal variation and vibrations. In addition to the semiconductor structure, the package may also include other components such as one or more light converters that convert the radiation into visible light of one or more other wavelengths among others. The semiconductor structure may be bonded to other elements within the package using an adhesive, which in some circumstances may be optically transparent to the radiation generated by the semiconductor structure.

SUMMARY

A light emitting package and method of making the package are described. The light emitting package contains an LED bonded to a light converting layer using an adhesive layer. The adhesive layer is jet printed, mask sprayed or extruded onto at least one of the surfaces before bonding. Different sections of the adhesive layer have different materials. The materials differ in refractive index, oxygen permeability, and/or heat conductivity. The materials are formed in concentric rings around the adhesive center, islands or lines. The materials are disposed to provide optical lensing or increasing permeability/heat conductivity with decreasing distance from the center. A substantially-reflective optical side coat surrounds the LED, adhesive layer and connecting structure.

BRIEF DESCRIPTION OF THE DRAWINGS

FIG. 1C shows an exemplary flowchart of a method of fabricating the structure shown in FIGS. 1A and 1B; FIG. 1D shows coaxial nozzles according to one embodiment; FIG. 1E shows a pattern dispersed by the coaxial nozzles of FIG. 1D;

DETAILED DESCRIPTION OF THE EMBODIMENTS

Figure 1A:
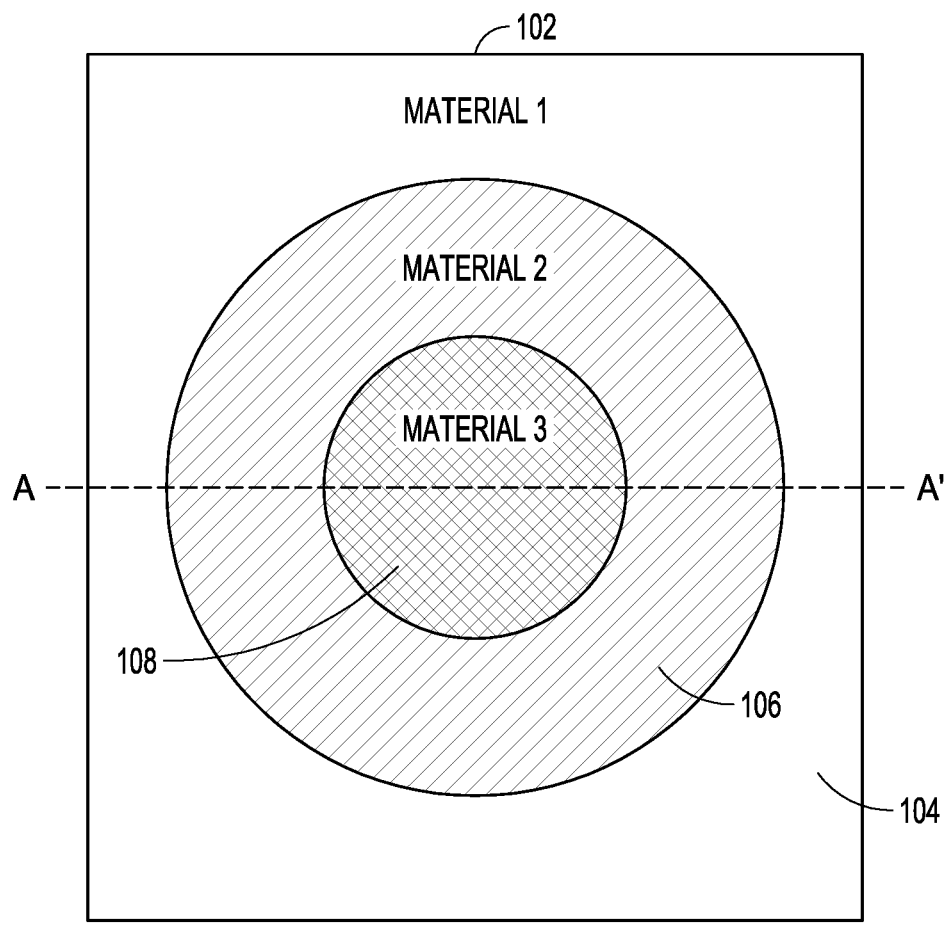
FIGS. 1A and 1B are examples of a top and cross-sectional view, respectively, of an LED device according to one embodiment.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper," "lower," "horizontal," or "vertical" may be used herein to describe a relationship of one element, layer, or region to another element, layer, or region as illustrated in the figures.

It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, LEDs may be used as light sources (e.g., flash lights and camera flashes) for hand-held battery-powered devices, such as cameras and cell phones. LEDs may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

High power LEDs, which may consume more than 1 watt in power and may produce over 50 lumens, may be used in a number of different applications. High power LEDs may be used in automotive lighting, for instance in car headlights, as well as flashlights and other equipment. The high-power LEDs may be fabricated in a semiconductor-based LED die that is bonded to a supporting structure via an adhesive layer. In some cases, if radiation from the LEDs is transmitted through the supporting structure, the adhesive layer may be optically transparent or substantially transparent to the emitted radiation. The optically transparent adhesive layer may have a singular refractive index, in which case the adhesive layer may not provide optical lensing of the radiation passing therethrough, unless the optically transparent adhesive layer varies in thickness in a direction normal to a propagation direction of the radiation. However, the presence of volatile organic contaminants in or near the adhesive layer may result in transient and/or permanent degradation of LED performance under high-power operating conditions. Experimental evidence suggests that the mechanism of degradation is sensitive to the availability of oxygen, such that the severity of degradation decreases with increasing oxygen permeation into the adhesive layer. The thermal profile of the LED may be such that the LED is hottest at or near the center of the LED light emitting area. Thus, the uniform nature of the adhesive layer may cause radiation impinging on the adhesive layer to pass through the adhesive layer without any lensing effects, may lead to non-variable/limited oxygen permeation into the adhesive layer, which can result in LED degradation, and may result in a non-optimal mismatch between the thermal profile of the LED and thermal conductivity/cooling profile of the adhesive layer. The structures described herein may thus be used in high power LED applications, such as vehicle (head) lights and may employ an adhesive layer that has one or more material characteristics that intentionally vary at different locations within the layer.

Figure 1B:
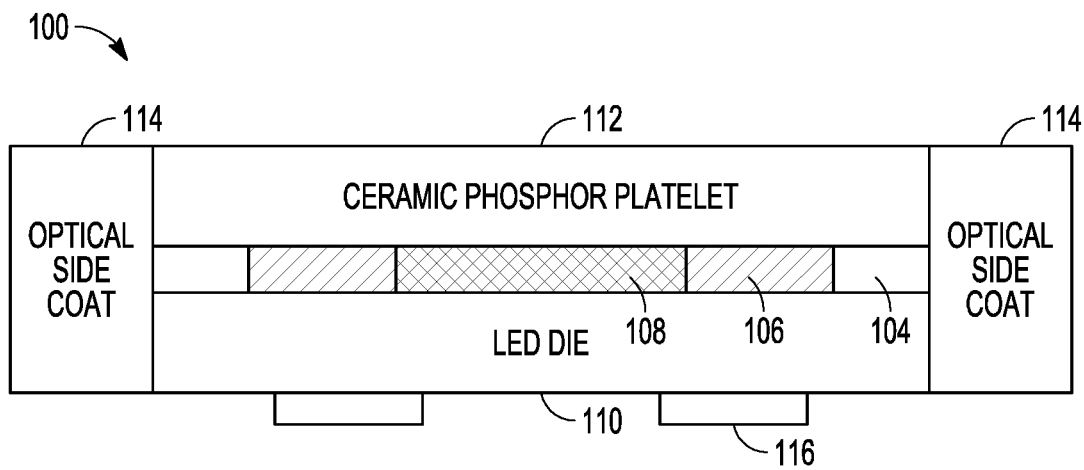

FIGS. 1A and 1B are a top and cross-sectional view, respectively, of an LED device according to one embodiment. In particular, FIGS. 1A and 1B show different views of a 'bulls-eye' structure, in which FIG. 1A shows a planar top view and FIG. 1B shows a cross-sectional view along cross-section A-A' of FIG. 1A. As shown, the planar top view of the LED device 100 includes an adhesive layer 102 that contains different material characteristics. The different material characteristics may be provided by different materials.

The adhesive layer 102 may extend over substantially an entire surface of an underlying LED die 110 (shown in FIG. 1B). The LED die 110 may be a micro LED, having a feature size of about, for example, 0.5 mm$^2$ to about 2.4 mm$^2$. The outermost section 104 of the adhesive layer 102 in FIG. 1A may be formed from a first material that has a first material characteristic, an annular ring 106 of the adhesive layer 102 may be formed from a second material that has a second material characteristic and an inner circular area 108 of the adhesive layer 102 may be formed from a third material that has a third material characteristic. In some embodiments, the outermost area may not be filled with a material (i.e., material 1 may not be present). The adhesive layer 102 may, in other embodiments, have more than a single annular ring area, each with a different material characteristic. The materials used may include one or more of, for example: Polydimethylsiloxane (PDMS) having a refractive index of 1.42 (LPS-9226D), phenylated silicone having a refractive index of 1.48 (LPS-9235D), phenylated silicone having a refractive index of 1.56 (LPS-9501D), and polysilazane with nanoparticles having a refractive index of 1.65 (M015).

As shown in FIG. 1B, the LED die 110 may have contacts 116 to drive the LED die 110. In addition, the adhesive layer 102 of the LED device 100 may be formed from, for example, silicone that is dispensed first over the surface of the LED die 110 or the transparent layer 112. The adhesive layer 102 (e.g., comprising silicone) may have a thickness of, for example, between about 0.5 μm to about 2.0 μm. Each material 104, 106, 108 that forms the adhesive layer 102 may be formed by aerosol jet printing the adhesive layer 102 on the LED die 110 and/or the transparent layer 112 rather than sandwiching a drop of dispensed silicone between the LED die 110 and the transparent layer 112. In some embodiments, the materials 104, 106, 108 may be printed sequentially such that all of a particular material is deposited before another material is deposited. In other embodiments, one or more coaxial nozzles may be used to dispense the materials 104, 106, 108 at or near the same time on the LED die 110 and/or the transparent layer 112. The transparent layer 112 may be, for example, a ceramic phosphor platelet. The adhesive layer 102 may bond the LED die 110110 and the transparent layer 112 together.

The material characteristic of the different materials 104, 106, 108 of the adhesive layer 102 may be selected to tailor the adhesive layer 102 to provide one or more of: optical lensing, enhanced oxygen permeation channels, or designed thermal profile. In each of these cases, a different material characteristic of the adhesive layer 102 may change dependent on the material 104, 106, 108. Specifically, optical lensing may be obtained by varying the refractive index values of the adhesive layer 102 such that the radiation emitted by the LED die 110 may be concentrated and/or steered in a desired manner. Enhanced oxygen permeation channels may be obtained by varying permeability values of the adhesive layer 102 such that oxygen can more readily diffuse into the regions of the adhesive layer 102 with increasingly higher permeability. In some embodiments, higher permeation material may present towards the center of the LED die 110, where oxygen-deprivation is most prominent, with lower permeation material being disposed far from the edges of the LED die 110, where oxygen is readily available. A designed thermal profile may be obtained by varying thermal conductivity values of the adhesive layer 102 such that higher thermal conduction can occur near the hottest regions of the LED die 110. In these areas, enhanced cooling may be used to the cool the LED die 110.

An optical side coat 114 may be formed to surround the adhesive layer 102, as well as the LED die 110 and transparent layer 112. The optical side coat 114 may reflect light emitted from the LED die 110 back through the platelet 112. The optical side coat 114 may be formed from, for example, $TiO_2$, a reflective metal or a dielectric mirror at the wavelength of the LED die 110.

FIG. 1C shows a flowchart of a method of fabricating the structure shown in FIGS. 1A and 1B. Although some operations are shown, the method 120 shown in FIG. 1C is not meant to be exclusive; additional operations may be incorporated into the method 120. At operation 122, the LED die 110 may be fabricated 122. The LED die fabrication may include deposition of different semiconductor layers (e.g., n, p, recombination/active) and formation of contacts 116 to the LED die 110, among others.

After the LED die 110 has been fabricated, design of the adhesive layer 102 may be determined at operation 124. The adhesive layer design may include selection of the material(s) and shape(s) to use to create the desired material characteristics of the adhesive layer 102. As above, in some embodiments different materials may be used to create the desired material characteristics of the adhesive layer 102.

After the design determination, the appropriate design and materials may be programmed into a jet printer or other deposition equipment. The first material may then be deposited at operation 126 at the determined (lateral) location(s)/in the determined shape(s). The first material may be any of the materials shown. For example, the first material may be the material 108 in the center of the adhesive layer 102. Alternatively, the first material may be the material 104 in the section of the adhesive layer 102 surrounding the material 108 at the center and the material 106 of the concentric ring. The deposition may be printed, for example, by rastering across the underlying surface (the LED die 110 or platelet 112), depositing the first material continuously or in increments, for example, of the feature size described herein.

The program and design may be stored in a non-transitory machine readable medium of the equipment (e.g., printer) in on which is stored one or more sets of data structures or instructions (e.g., software) embodying or utilized by any one or more of the techniques or functions described herein. The instructions may also reside, completely or at least partially, within a main memory, within static memory, and/or within the hardware processor during execution thereof by the equipment. The machine-readable medium may include a single medium or multiple media (e.g., a centralized or distributed database, and/or associated caches and servers) configured to store the one or more instructions. The term "machine readable medium" may include any medium that is capable of storing, encoding, or carrying instructions for execution by the equipment and that cause the equipment to perform any one or more of the techniques indicated herein, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. The instructions may further be transmitted or received over a communications network using a transmission medium via a network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, next generation/new radio standards among others.

After depositing the material, a determination is made at operation 128 whether another material is to be deposited. If so, the printer may select the next material at operation 130 and return to operation 126, where the next material may then be deposited at the determined location(s)/in the determined shape(s) for that material. In some embodiments, a spray mask may be used to set the locations, in which a mask is applied, the adhesive is sprayed on, and then the mask is removed (e.g., to form islands or lines as described below). In other embodiments, the jet printer may advance from position to position on the underlying surface and deposit the desired adhesive material, switching between adhesive materials when a location on which a different adhesive material is to be deposited is reached. In further embodiments, photolithographic techniques similar to those used to form semiconductor structures may be used to deposit the adhesive material to form the adhesive layer. Alternatively, imprint lithography may be used to deposit the adhesive material to form the adhesive layer.

In some embodiments, the location(s) where the next material is deposited may be essentially completely different from (i.e., non-overlapping with) the location(s) in which the other materials have been deposited. In other embodiments, to obtain the desired material characteristics, multiple layers of different materials may be deposited at the same location(s). In this case, the next material may completely or partially overlap with one or more other deposited materials.

If, however, a determination is made at operation 128 that no other material is to be deposited, the structure containing the adhesive layer 102 (that may now be patterned) may be removed from the printer (or other equipment). The other structure (e.g., the LED die 110 or platelet 112 on which the adhesive layer 102 has not been deposited) may be placed on and attached to the structure on which the adhesive layer 102 has been deposited. The adhesion of the LED die 110 and platelet 112 may result in minimal spreading/overlap of the adhesive materials.

In some embodiments, the adhesive layer 102 may be deposited in a single dispersion, rather than being printed, after which the two structures (LED die 110 and platelet 112) may be attached together using the adhesive layer 102. For example, the material may be extruded from coaxial nozzles. FIG. 1D shows coaxial nozzles according to one embodiment while FIG. 1E shows a pattern dispersed by the coaxial nozzles of FIG. 1D. As shown, the nozzle structure 150 contains 3 coaxial nozzles 152, 154, 156 with circular nozzle heads. In other embodiments, the nozzle heads may take other shapes, which may be the same or may be different. Each nozzle 152, 154, 156 may be connected with a different interior dispense chamber that contains a different adhesive material. This may permit the nozzle structure 150 to simultaneously dispense respective materials 152*a*, 154*a*, 156*a* on the underlying structure 140 (e.g., LED die 110 or platelet 112) to obtain the "bulls-eye" adhesive pattern shown in FIG. 1E.

In some embodiments, although other material characteristics may vary, only one of the above material characteristics (refractive index, oxygen permeability, thermal conductivity) may be different in the different materials. In other embodiments, more than one of the material characteristics may be different in the different materials. In this case, the size and/or shape of the regions formed by deposition of the materials may be dependent on the material characteristic change. In addition, in some embodiments, adjacent regions may have a predefined transition region therebetween (e.g., between the annular ring and the center) in which the adhesive layer has material properties that are intermediate between that of the adjacent regions. This predefined transition region may be formed by creating steps of material having an intermediate material characteristic between that of the adjacent material. In some embodiments, the inner circular area 108 and/or the annular ring 106 may be offset from the center of the adhesive layer 102. In some embodiments, rather than a circle, other shapes may be used, such as an oval. In this case, the annular ring may correspond to the center shape.

Figure 2A:
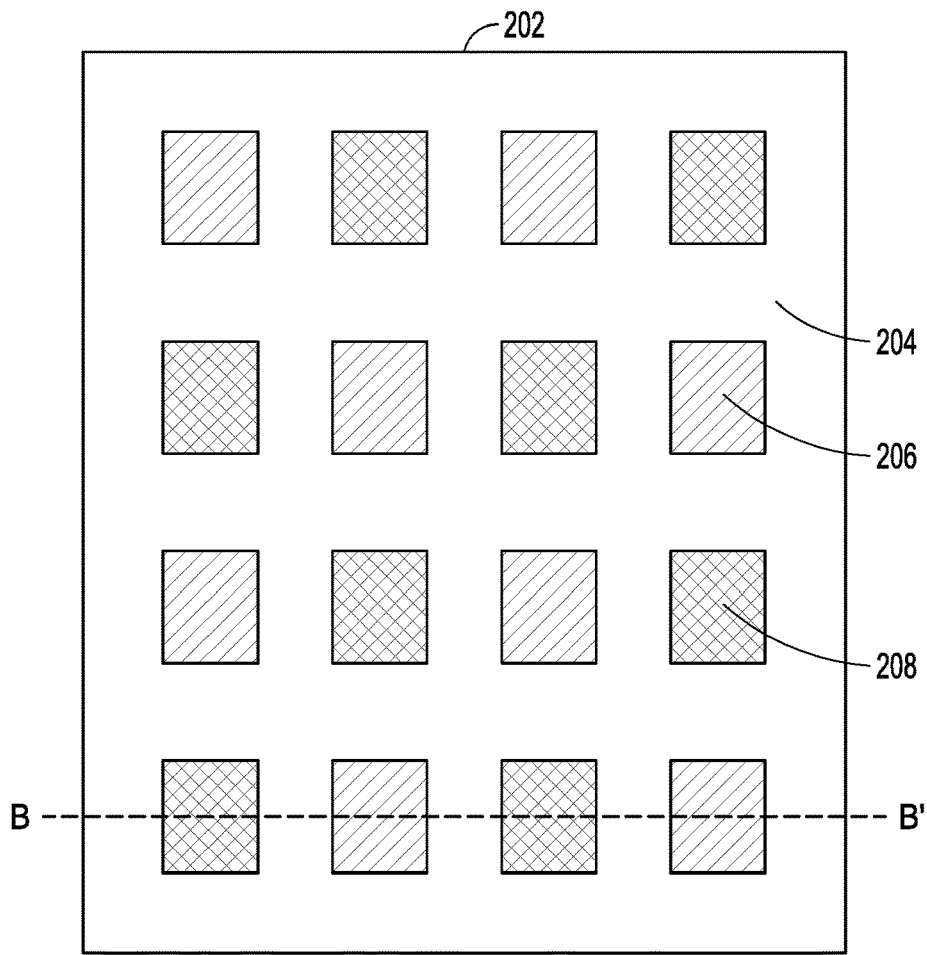
FIGS. 2A and 2B are examples of a top and cross-sectional view, respectively, of an LED device according to another embodiment.
Figure 2B:
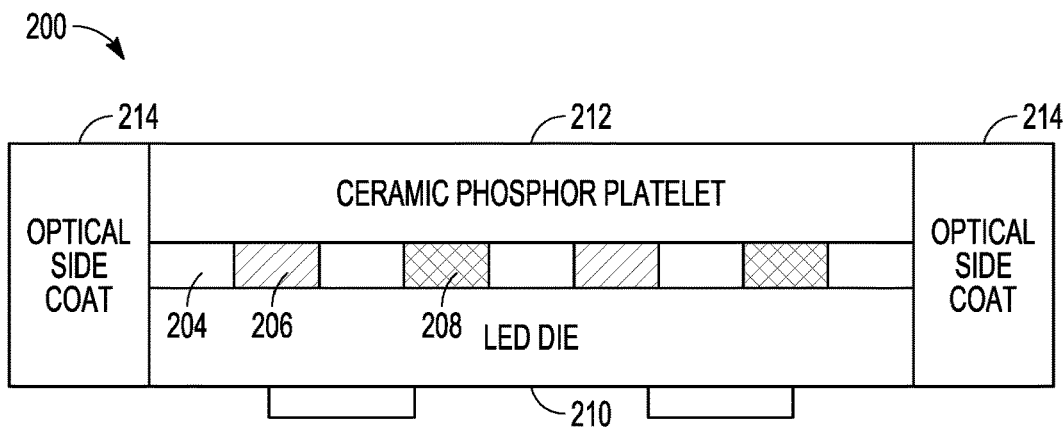

FIGS. 2A and 2B are a top and cross-sectional view, respectively, of an LED device according to another embodiment. FIGS. 2A and 2B show different views of an 'island" structure, in which FIG. 2A shows a planar top view and FIG. 2B shows a cross-sectional view along cross-section B-B' of FIG. 2A. As shown, the planar top view of the LED device 200 includes an adhesive layer 202 that may extend over substantially an entire surface of an underlying LED die 210. The adhesive layer 202 may contain islands 206, 208 of materials having different material characteristics. Note that although the islands 206, 208 are shown as being square, they may be a different shape, such as circular. Further, a layout of the islands may be formed other than in rows and columns. For example, the islands may be radially distributed, in a series of concentric rings in some embodiments. In other embodiments, the islands may be laid out along an Archimedes spiral or any combination of the above-mentioned layouts. The materials 206, 208 may also different material characteristics of the material forming the region 204 of the adhesive layer 202 that surrounds the islands 206, 208. As above, in some embodiments, the region 204 that surrounds the islands 206, 208 may not be filled with a material (i.e., material 1 may not be present).

As shown in FIG. 2B, the adhesive layer 202 of the LED device 200 may be formed from silicone that is dispensed over the surface of the LED die 210 or the transparent layer 212. The adhesive layer 202 (e.g., comprising silicone) may have a thickness as above of between about 0.5 µm to about 2.0 µm. The adhesive layer 202 may be formed by aerosol jet printing the different materials 204, 206, 208 that form the adhesive layer 202 on the LED die 210 and/or the transparent layer 212 or by using coaxial nozzles, in a similar manner as that described in reference to FIG. 1C, above. The transparent layer 212 may be, for example, a ceramic phosphor platelet. The adhesive layer 202 may bond the LED die 210 and the transparent layer 212 together.

The islands 206, 208 and surrounding material 204 of the adhesive layer 202 may, similar to the above, have only one, or more than one, of the material characteristics (refractive index, oxygen permeability, thermal conductivity) differ. The feature size of the islands may be about 20 µm. As shown, the material characteristics of the islands 206, 208 may alternate in substantially orthogonal directions such that adjacent islands have at least one different material characteristic. As used in herein substantially orthogonal directions includes all directions within about 5-10° of orthogonal directions. As above, the pattern of alteration of the material characteristics may be different from that shown in FIG. 2A, such as having groupings of islands 206, 208 (separated by the intervening material 204) having the same material characteristics in one or more of the substantially orthogonal directions. Although the islands 206, 208 are shown as only being formed from two different materials, a greater number of materials may be used. This may permit the material characteristic to be different in different substantially orthogonal directions as the material of an adjacent island in one direction may be different than that in the substantially orthogonal direction. Thus, the pattern of change for one material characteristic may be the same as that of the other material characteristic in one or both substantially orthogonal directions or may differ in both substantially orthogonal directions.

Although only two sets of islands 206, 208 are shown, in other embodiments, the number of types of islands may be larger or smaller. Similarly, the number and/or size of the islands 206, 208 in one or more of the substantially orthogonal directions may be different in other embodiments. In other embodiments, although the size and placement of the islands 206, 208 are regular, in other embodiments the size and/or placement of the islands 206, 208 in one or more of the substantially orthogonal directions may vary across the adhesive layer 202 such that width of the surrounding material 204 between adjacent islands 206, 208 may be different dependent on the location within the adhesive layer 202. In some embodiments, the islands may be formed from the same adhesive material (rather than at least two different adhesive materials), which is different from the adhesive material surrounding the islands.

Similar to the embodiment shown in FIG. 1B, an optical side coat 214 may be formed to surround the adhesive layer 202, as well as the LED die 210 and transparent layer 212.

Figure 3A:
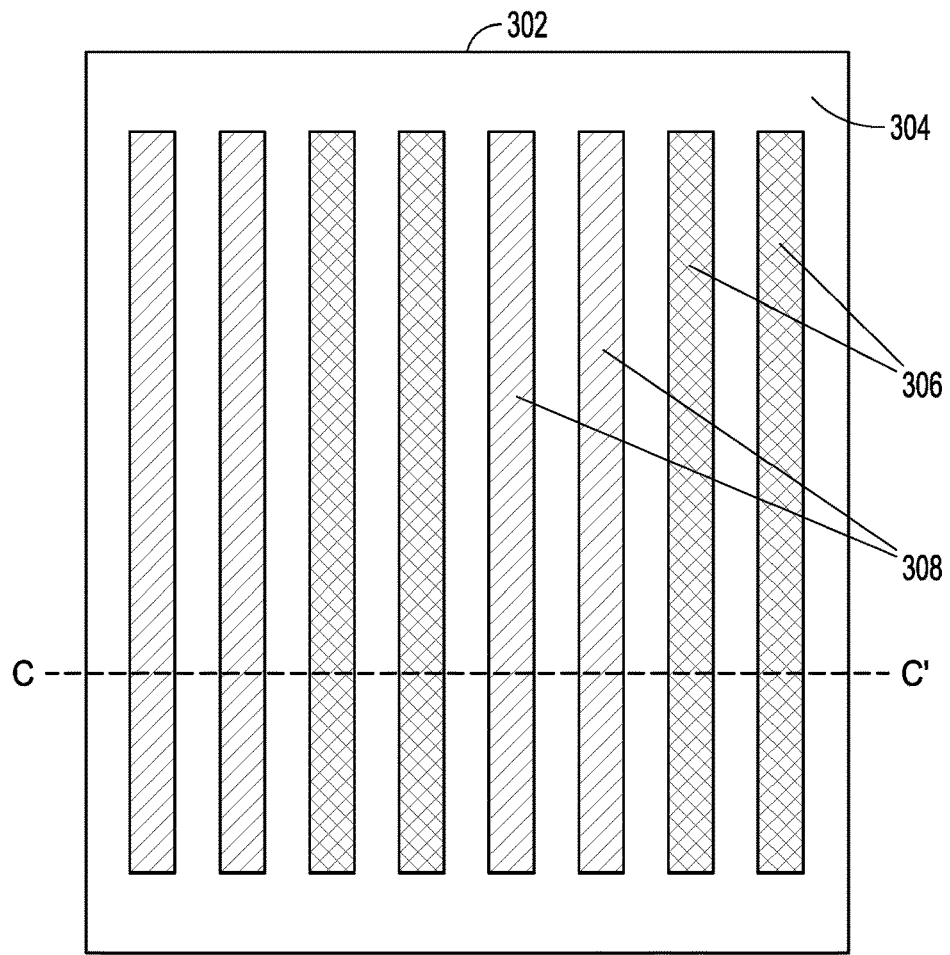
FIGS. 3A and 3B are examples of a top and cross-sectional view, respectively, of an LED device according to another embodiment.
Figure 3B:
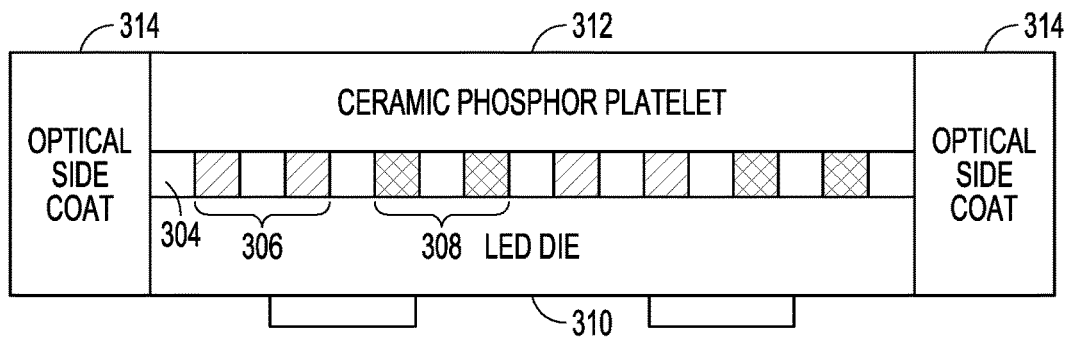

FIGS. 3A and 3B are a top and cross-sectional view, respectively, of a LED device according to another embodiment. FIGS. 3A and 3B show different views of a linear structure, in which FIG. 3A shows a planar top view and FIG. 3B shows a cross-sectional view along cross-section C-C' of FIG. 3A. As shown, the planar top view of the LED device 300 includes an adhesive layer 302 that may extend over substantially an entire surface of an underlying LED die 310 and contains line 306, 308 formed from different materials that have different material characteristics and different material characteristics of the material forming the region 304 of the adhesive layer 302 that surrounds the lines 306, 308. As above, in some embodiments, the region 304 that surrounds the lines 306, 308 may not be filled with a material (i.e., material 1 may not be present).

As shown in FIG. 3B, the adhesive layer 302 of the LED device 300 may be formed from silicone that is dispensed over the surface of the LED die 310 or the transparent layer 312. The adhesive layer 302 may have a thickness as above of between about 0.5 µm to about 2.0 µm and, as above, may be formed by aerosol jet printing the adhesive layer 302 on the LED die 312 and/or the transparent layer 312, in a similar manner as that described in reference to FIG. 1C, above. The transparent layer 312 may be, for example, a ceramic phosphor platelet. The adhesive layer 302 may bond the LED die 312 and the transparent layer 312 together.

The lines 306, 308 and surrounding material 304 of the adhesive layer 302 may, similar to the above, have only one, or more than one, of the material characteristics (refractive index, oxygen permeability, thermal conductivity) differ. As shown, the material characteristics of the lines 306, 308 may alternate such that adjacent pairs of lines have at least one different material characteristic. As above, the pattern of alteration of the material characteristics may be different from that shown in FIG. 3A, such as alternating lines 306, 308 (separated by the intervening material 304) or sets of more than two adjacent lines 306, 308 having the same material characteristics. Moreover, if more than one material characteristic of the lines 306, 308, the pattern of change for each material characteristic may be independent of the pattern for other material characteristics. Thus, the pattern of change for one material characteristic may be the same as that of, or may differ from, the other material characteristic.

In some embodiments, one or more of the material characteristics may vary along the length of one or more of the lines 306, 308 via steps of different materials. Like the embodiment shown in FIGS. 1A and 2A, the lines 306, 308 may have a predefined transition region therebetween in which the adhesive layer has material properties that are intermediate between that of the line 306, 308 and the surrounding material 304 via steps of different materials. Although only two sets of lines 306, 308 are shown, in other embodiments, the number of types of lines may be larger or smaller. Similarly, the number and/or size of the lines 306, 308 in one or more of the substantially orthogonal directions may be different in other embodiments. In other embodiments, although the size and placement of the lines 306, 308 are regular, in other embodiments the size and/or placement of the lines 306, 308 in one or more of the substantially orthogonal directions may vary across the adhesive layer 302 such that width of the surrounding material 304 between adjacent lines 306, 308 may be different dependent on the location within the adhesive layer 302.

Similar to the embodiment shown in FIG. 1B, an optical side coat 314 may be formed to surround the adhesive layer 302, as well as the LED die 310 and transparent layer 312.

Although separate embodiments are described in FIGS. 1-3, in other embodiments, one or more of the embodiments described may be combined. For example, sections that are lines and islands may be used in one or more of the substantially orthogonal directions.

Figure 4A:
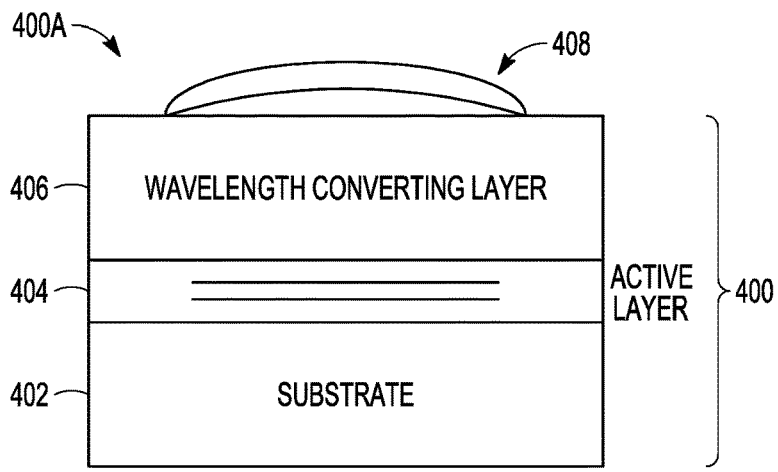
FIGS. 4A and 4B are exemplary diagrams respectively showing an LED device and multiple LED devices.

FIG. 4A is a diagram of a LED or other light emitting device in an exemplary embodiment. The LED device 400 may be similar to the device shown in FIGS. 1-3 and may include a substrate 402 and an active layer 404 in the die, a wavelength converting layer 406. The LED system 400A may include the LED device 400 and primary optic 408. In other embodiments, an LED device may not include a wavelength converter layer and/or primary optics.

As shown in FIG. 4A, the active layer 404 may be adjacent to the substrate 402 and emit light when recombination of electrons and holes injected into the active layer 404 occurs therein from surrounding n and p type semiconductor layers. Suitable materials used to form the substrate 402 include sapphire, SiC, GaN, Silicon or other elemental and compound materials suitable to providing support for the active layer. Suitable materials used to form the active layer 404 and surrounding layers may more specifically be formed from a compound semiconductor including, but not limited to, a binary, ternary or quaternary compound III-V semiconductor such AlN, AlP, AlAs, AlSb, GaN, GaP, GaAs, GaSb, InN, InP, InAs, InSb, and mixtures or alloys thereof (e.g., AlGaAs, InGaP, InGaAlP), one or more II-VI semiconductors including, but not limited to, ZnS, ZnSe, CdSe, CdTe, or one or more group IV semiconductors including, but not limited to Ge, Si, SiGe.

The wavelength converting layer 406 may be remote from (e.g., one or more intervening layers or materials transparent to the radiation emitted) or directly adjacent to the active layer 404. The active layer 404 may emit a visible wavelength or non-visible wavelength (e.g., ultraviolent) into the wavelength converting layer 406. The wavelength converting layer 406 absorb the wavelength of the radiation emitted by the active layer 404 and re-emit at least a portion of the radiation as light of one or more different wavelengths, for example a visible wavelength or visible spectrum such as "cool" or "warm" white light. LED devices that include a wavelength converting layer are often referred to as phosphor converted LEDs ("PCLED"). The wavelength converting layer 406 may include any luminescent material, such as, for example, phosphor particles in a transparent or translucent binder or matrix, or a ceramic phosphor element, which absorbs light of one wavelength and emits light of a different wavelength. In some cases, the wavelength converting layer 406 may be designed or otherwise allow a portion of the radiation emitted by the active layer 404 may not interact with the phosphor particles in the wavelength converting layer 406 and thus some of the radiation emitted by the active layer 404 may pass through the wavelength converting layer 406.

The primary optic 408 may be on or over one or more layers of the LED device 400 and allow light to pass from the active layer 404 and/or the wavelength converting layer 406 through the primary optic 408. The primary optic 408 may be a lens or encapsulant configured to protect the one or more layers and to, at least in part, shape the output of the LED device 400. Primary optic 408 may include transparent and/or semi-transparent material and may be, for example, a total internal reflection (TIR) lens, Fresnel lens or any other lens. In exemplary embodiments, light via the primary optic may be emitted based on a Lambertian distribution pattern. It will be understood that one or more properties of the primary optic 408 may be modified to produce a light distribution pattern that is different than the Lambertian distribution pattern.

In some embodiments, a scattering or off state white layer may be disposed over the wavelength converting layer 406. The layer may include particles of, for example, TiOx, particles of another scattering material, or any off state white material, such as paraffin, disposed in an optically transparent material or matrix. The white layer may be used to provide scattering of light impinging thereon and/or to provide a white appearance when the LED is deactivated.

Figure 4B:
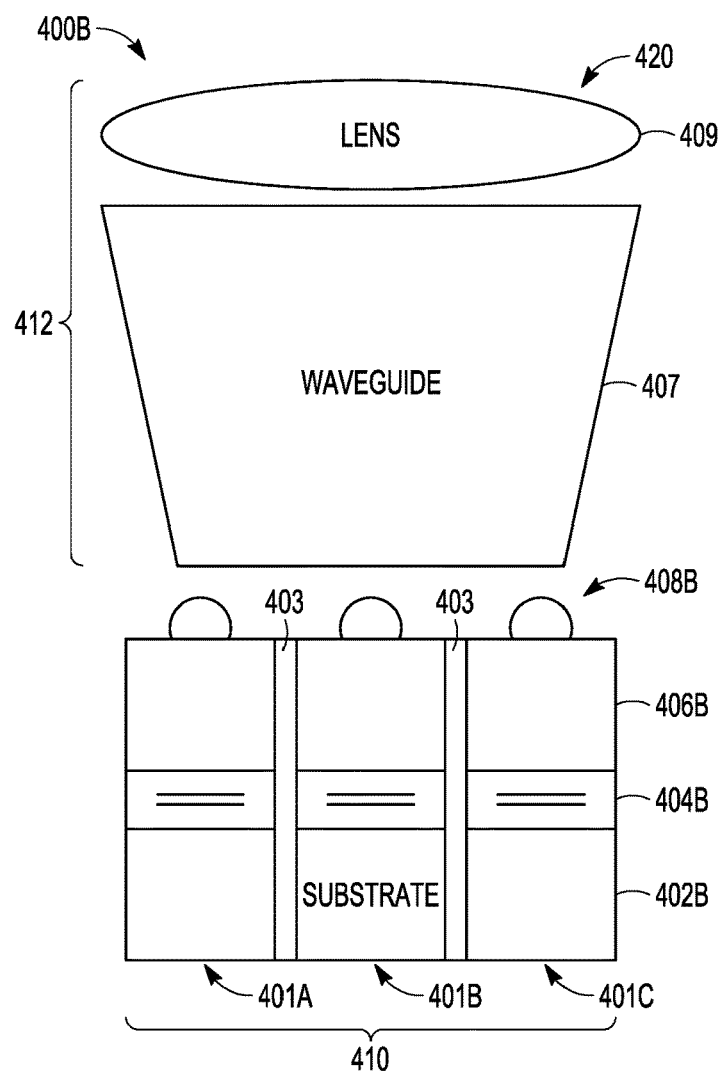

FIG. 4B shows a cross-sectional view of a lighting system in an exemplary embodiment. The lighting system 420 may include an LED array 410 that includes pixels 401A, 401B, and 401C. Each pixel 401A, 401B, and 401C may include elements similar to that shown in FIGS. 1-4A, such as a respective wavelength converting layer 406B, active layer 404B and substrate 402B. The wavelength converting layer 406B for each pixel 401A, 401B, and 401C may be the same, or the wavelength converting layer 406B of at least one of the pixels 401A, 401B, and 401C may differ. The LED array 410 may be, for example, a monolithic LED array manufactured using wafer level processing techniques, a micro LED with sub-500 micron dimensions, or the like. Pixels 401A, 401B, and 401C, in the LED array 410 may be formed using, for example, array segmentation, or alternatively using pick and place techniques.

The spaces 403 shown between one or more pixels 401A, 401B, and 401C of the LED system 400B may include an air gap or may be completely or partially filled by an insulating material, such as polyimide. In other embodiments, the spaces 403 may be completely or partially filled by a conducting material, such as a contact (e.g., an n-contact).

The secondary optics 412 may include one or both of the lens 409 and waveguide 407. Although secondary optics are discussed in accordance with the example shown, in other exemplary embodiments, the secondary optics 412 may be used to spread the incoming light (diverging optics), or to gather incoming light into a collimated beam (collimating optics). In exemplary embodiments, the waveguide 407 may be a concentrator and may have any applicable shape to concentrate light such as a parabolic shape, cone shape, beveled shape, or the like. The waveguide 407 may be coated with a dielectric material, a metallization layer, or the like used to reflect or redirect incident light. In alternative embodiments, a lighting system may not include one or more of the following: the wavelength converting layer 406B, the primary optics 408B, the waveguide 407 and the lens 409.

Lens 409 may be formed from any applicable transparent material such as, but not limited to SiC, aluminum oxide, diamond, or the like or a combination thereof. Lens 409 may be used to modify a beam of light impinging on the lens 409 such that an output beam from the lens 409 may efficiently meet a desired photometric specification. Additionally, lens 409 may serve one or more aesthetic purposes, such as by determining a lit and/or unlit appearance of the pixel 401A, 401B and/or 401C of the LED array 410.

Figure 5:
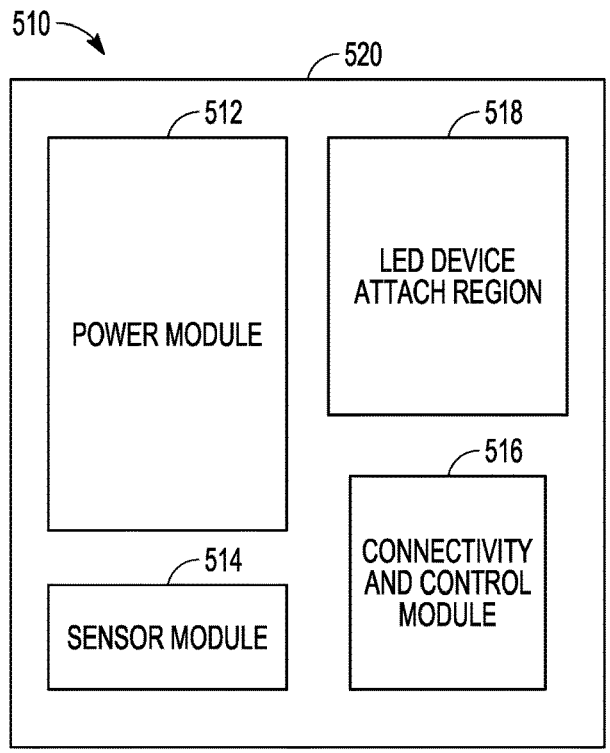
FIG. 5 is a top view of an exemplary printed-circuit board (PCB) for an integrated LED lighting system according to one embodiment.

FIG. 5 is a top view of an electronics board 510 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 510 includes a power module 512, a sensor module 514, a connectivity and control module 516 and an LED attach region 518 reserved for attachment of an LED array to a substrate 520.

The substrate 520 may be any board capable of mechanically supporting, and providing electrical coupling to, electrical components, electronic components and/or electronic modules using conductive connecters, such as tracks, traces, pads, vias, and/or wires. In some examples, the substrate 520 may be a printed circuit board (PCB) containing multiple dielectric and conducting layers. The conducting layers may be formed from a metal, such as copper, gold or aluminum. The conducting layers may include a ground plane and one or more planes containing circuitry (or traces). The dielectric layers may be formed from, for example, a glass-reinforced epoxy laminate (such as FR4) or other materials. The conducting layers may be connected via contact holes through one or more of the dielectric layers The power module 512 may include electrical and/or electronic elements. In an exemplary embodiment, the power module 512 includes an AC/DC conversion circuit, a DC/DC conversion circuit, a dimming circuit, and an LED driver circuit.

The sensor module 514 may include sensors used for an application in which the LED array is to be implemented. The sensors may be photodiodes, for example.

The connectivity and control module 516 may include the system microcontroller and any type of wired or wireless module configured to receive a control input from an external device.

The term module, as used herein, may refer to electrical and/or electronic components disposed on individual circuit boards that may be soldered or otherwise electrically bonded to one or more electronics boards 510. The term module may, however, also refer to electrical and/or electronic components that provide similar functionality, but which may be individually soldered or otherwise bonded to one or more circuit boards in a same region or in different regions.

Figure 6A:
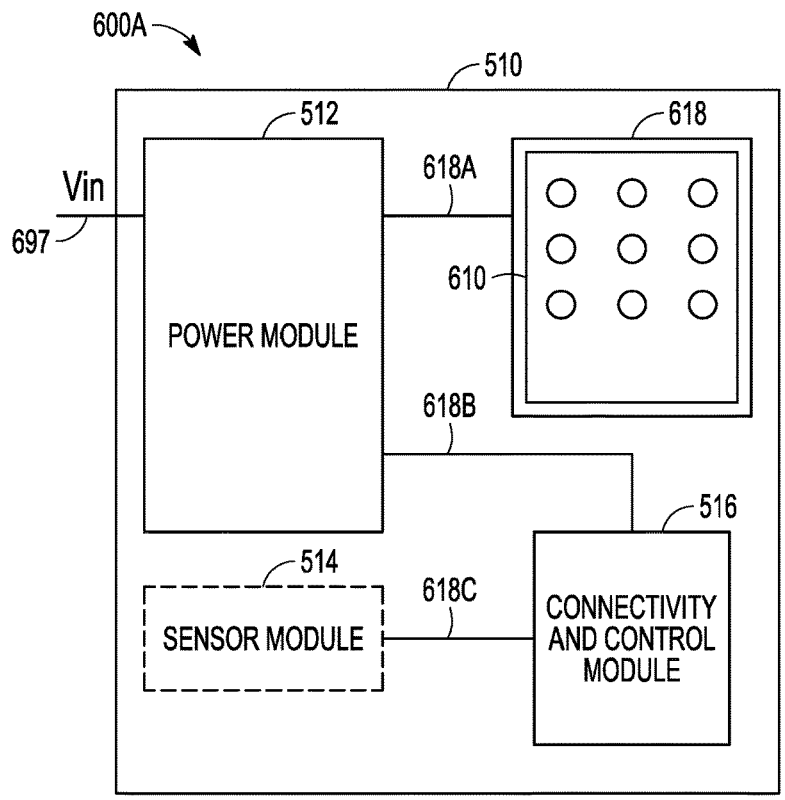
FIG. 6A is a top view of the electronics board with LED array attached to the substrate at the LED device attach region in one embodiment.

FIG. 6A is a top view of the electronics board with an LED array attached to the substrate at the LED device attach region in one embodiment. The PCB 510 together with the LED array 610 may represent an LED system 600A in accordance with some embodiments. Additionally, the power module 512 may receive a voltage input at Vin 697 and control signals from the connectivity and control module 516 over traces 618B and provide drive signals to the LED array 610 over traces 618A. The traces 618A and 618B may be formed on one or more layers of the PCB 510. The LED array 610 may be activated and deactivated via the drive signals from the power module 512. In the embodiment shown in FIG. 6A, the connectivity and control module 516 may receive sensor signals from the sensor module 514 over trace 618C, which may be formed on the same layer of the PCB 510 as one or both traces 618A and 618B or may be formed on a different layer.

Figure 6B:
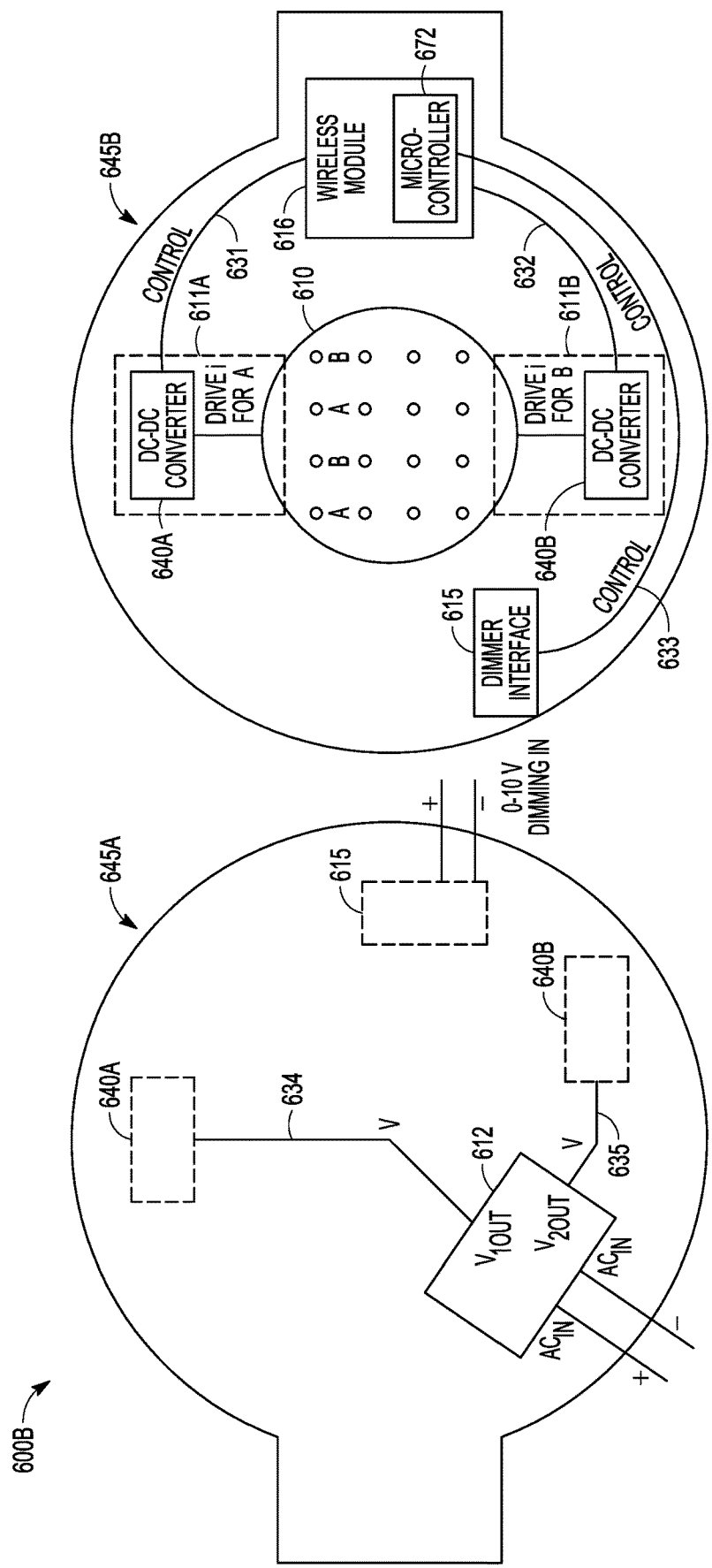
FIG. 6B is a diagram of one embodiment of a two channel integrated LED lighting system with electronic components mounted on two surfaces of a circuit board.

FIG. 6B illustrates one embodiment of a two channel integrated LED lighting system with electronic components mounted on two surfaces of a circuit board. As shown in FIG. 6B, an LED lighting system 600B may include a first surface 645A having inputs to receive dimmer signals and AC power signals and an AC/DC converter circuit 612 mounted thereon. The LED lighting system 600B may include a second surface 645B with the dimmer interface circuit 615, DC-DC converter circuits 640A and 640B, a connectivity and control module 616 (a wireless module in this example) having a microcontroller 672, and an LED array 610 mounted thereon. The LED array 610 may be driven by two independent channels 611A and 611B. In alternative embodiments, a single channel may be used to provide the drive signals to an LED array, or any number of multiple channels may be used to provide the drive signals to an LED array.

The LED array 610 may include two groups of LED devices. In an exemplary embodiment, the LED devices of group A may be electrically coupled to a first channel 611A and the LED devices of group B are electrically coupled to a second channel 611B. Each of the two DC-DC converters 640A and 640B may provide a respective drive current via single channels 611A and 611B, respectively, for driving a respective group of LEDs A and B in the LED array 610. The LEDs in one of the groups of LEDs may be configured to emit light having a different color point than the LEDs in the second group of LEDs. Control of the composite color point of light emitted by the LED array 610 may be tuned within a range by controlling the current and/or duty cycle applied by the individual DC/DC converter circuits 640A and 640B via a single channel 611A and 611B, respectively. Although the embodiment shown in FIG. 6B does not include a sensor module (as described in FIG. 5 and FIG. 6A), an alternative embodiment may include a sensor module.

The illustrated LED lighting system 600B is an integrated system in which the LED array 610 and the circuitry for operating the LED array 610 may be provided on a single PCB. Connections between modules on the same surface of the PCB may be electrically coupled for exchanging, for example, voltages, currents, and control signals between modules, by surface or sub-surface interconnections, such as traces 631, 632, 633, 634 and 635 or metallization layers and/or vias (not shown). Connections between modules on opposite surfaces of the PCB may be electrically coupled by through board interconnections, such as vias and metallization layers (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series, in parallel, or in a series-parallel combination and the light having different color points may be provided. For example, warm white light may be provided by a first group of LEDs, a cool white light may be provided by a second group of LEDs, and a neutral white light may be provided by a third group of LEDs.

Figure 7:
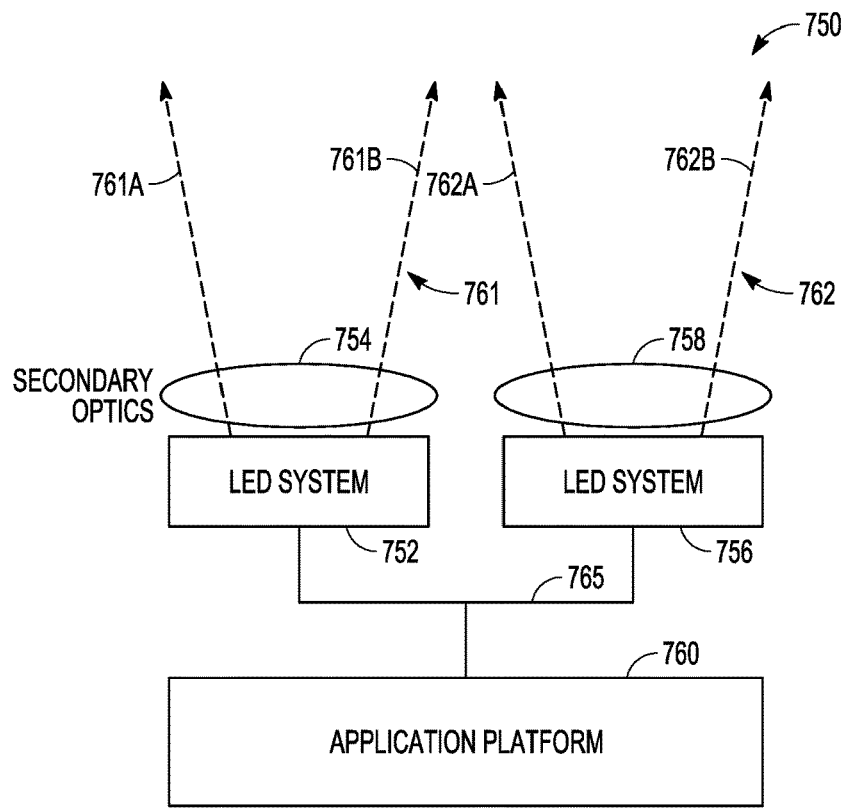
FIG. 7 is a diagram of an example application system containing the LED device.

FIG. 7 shows an example system which includes an application platform, LED systems, and secondary optics. The LED System 752 may produce light beams 761 shown between arrows 761a and 761b. The LED System 756 may produce light beams 762 between arrows 762a and 762b. In the embodiment shown in FIG. 7, the light emitted from LED system 752 may pass through secondary optics 754, and the light emitted from the LED System 756 may pass through secondary optics 758. One or more of secondary optics 754, 758 may be separate from the LED system 752, 756. In alternative embodiments, the light beams 761 and/or 762 may not pass through any secondary optics. The secondary optics may be or may include one or more light guides. The one or more light guides may be edge lit or may have an interior opening that defines an interior edge of the light guide. LED systems 752 and/or 756 may be inserted in the interior openings of the one or more light guides such that LED systems 752 and/or 756 inject light into the interior edge (interior opening light guide) or exterior edge (edge lit light guide) of the one or more light guides. LEDs in LED systems 752 and/or 756 may be arranged around the circumference of a base that is part of the light guide. According to various embodiments, the base may be thermally conductive and/or may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 752 and 756 to be shaped in a desired manner such as, for example, with a gradient, a chamfered distribution, a narrow distribution, a wide distribution, an angular distribution, or the like.

In exemplary embodiments, the system 750 may be a mobile phone of a camera flash system, indoor residential or commercial lighting, outdoor light such as street lighting, an automobile, a medical device, AR/VR devices, and robotic devices.

In exemplary embodiments, the system 750 may be a mobile phone of a camera flash system, indoor residential or commercial lighting, outdoor light such as street lighting, an automobile, a medical device, augmented realty/virtual reality (AR/VR) devices, and robotic devices. The LED System 400A shown in FIG. 4A and LED System 400B shown in FIG. 4B illustrate LED systems 752 and 756 in exemplary embodiments.

The application platform 760 may provide power to the LED systems 752 and/or 756 via a power bus via line 765 or other applicable input, as discussed herein. Further, application platform 760 may provide input signals via line 765 for the operation of the LED system 752 and LED system 756, which input may be based on a user input/preference, a sensed reading, a pre-programmed or autonomously determined output, or the like. One or more sensors may be internal or external to the housing of the application platform 760.

In various embodiments, application platform 760 sensors and/or LED system 752 and/or 756 sensors may collect data such as visual data (e.g., LIDAR data, IR data, data collected via a camera, etc.), audio data, distance-based data, movement data, environmental data, or the like or a combination thereof. The data may be related to a physical item or entity such as an object, an individual, a vehicle, etc. For example, sensing equipment may collect object proximity data for an advanced driver-assistance system/automated vehicle (ADAS/AV)-based application, which may prioritize the detection and subsequent action based on the detection of a physical item or entity. The data may be collected based on emitting an optical signal by, for example, LED system 752 and/or 756, such as an IR signal and collecting data based on the emitted optical signal. The data may be collected by a different component than the component that emits the optical signal for the data collection. Continuing the example, sensing equipment may be located on an automobile and may emit a beam using, for example, a vertical-cavity surface-emitting laser (VCSEL). The one or more sensors may sense a response to the emitted beam or any other applicable input.

In an exemplary embodiment, application platform 760 may represent an automobile and LED system 752 and LED system 756 may represent automobile headlights. In various embodiments, the system 750 may represent an automobile with steerable light beams where LEDs may be selectively activated to provide steerable light. For example, an array of LEDs may be used to define or project a shape or pattern or illuminate only selected sections of a roadway. In an exemplary embodiment, infrared cameras or detector pixels within LED systems 752 and/or 756 may be sensors that identify portions of a scene (roadway, pedestrian crossing, etc.) that require illumination.

Figure 8:
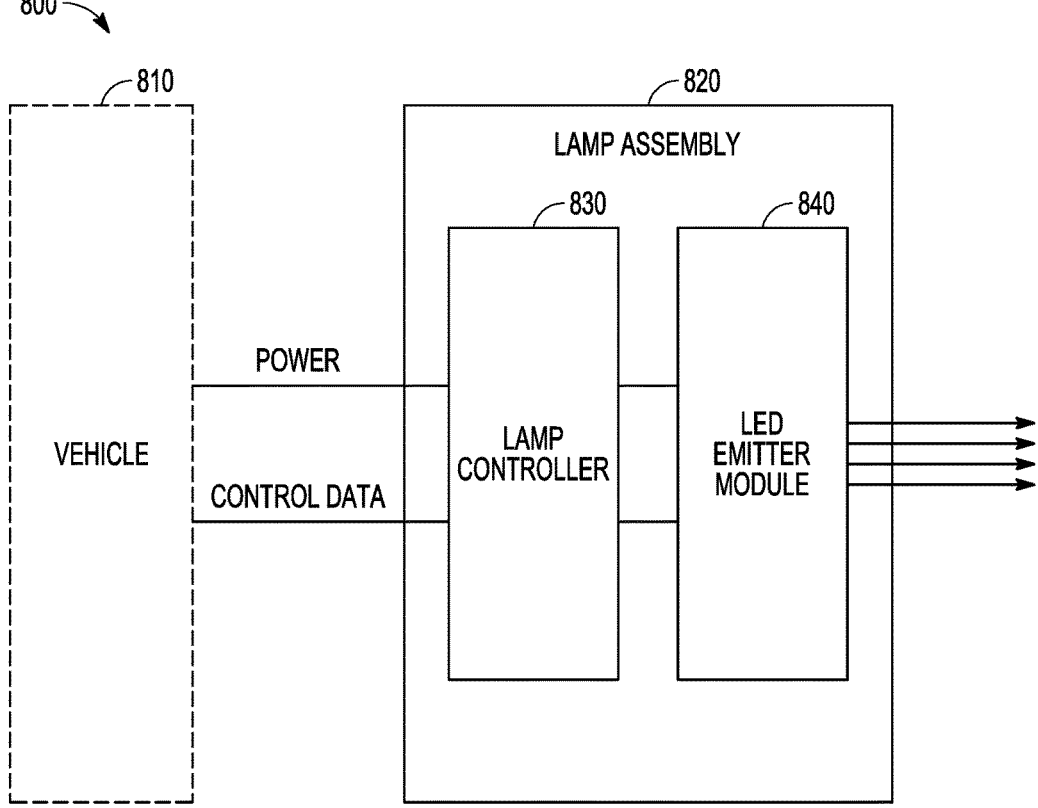
FIG. 8 is a diagram of an example vehicle system containing the LED device.

FIG. 8 is a diagram of an example vehicle system containing the LED device. As shown, the system 800 may include the vehicle 810 and lamp assembly 820. The lamp assembly 820 may include an LED emitter module 840 that contains one or more of the LED devices described above and a lamp controller 830 that controls the LED emitter module.

The vehicle 810 may be any manned (e.g., automobile, motorcycle, aircraft, ship) or unmanned (e.g., drone) device configured to move between geographic locations under its own power. The vehicle 810 may provide power and control data to the lamp assembly 820, controlled by a processor in the vehicle 810. The control data may indicate when the lamp controller 830 is to activate one or more of the LEDs of the LED emitter module 840 and when the lamp controller 830 is to deactivate one or more of LEDs of the LED emitter module 840.

The lamp controller 830 may contain circuitry such as one or more of switches, amplifiers, buffers, and other elements that enable individual control of the LED devices using power and control signals. In some embodiments, the lamp controller 830 may contain a separate processor to receive the control data from the vehicle 810 and control the LED devices accordingly. The lamp controller 830 may, in some embodiments, provide feedback control data to the processor in the vehicle 810 to better control the illumination provided by the LED emitter module 840. The feedback control data, for example, may include ambient light detected by one or more sensors in the lamp assembly 820 or an indication of failure of an element in the lamp assembly 820, such as one of the LEDs in the LED emitter module 840.

The LED emitter module 840 may illuminate a forward path and/or reverse path of the vehicle 800. For example, for an automobile, if the lamp assembly 820 is disposed in a headlamp, the LED emitter module 840 may illuminate the road ahead. The lamp assembly 820 may in addition or instead be disposed in rear (tail) lights, or side lights (e.g., in side mirrors) of the automobile.

Having described the embodiments in detail, those skilled in the art will appreciate that, given the present description, modifications may be made to the embodiments described herein without departing from the scope of the inventive concept. Therefore, it is not intended that the scope of the invention be limited to the specific embodiments illustrated and described.

What is claimed is:

1. A light emitting device comprising:
   a die comprising a light emitting semiconductor structure configured to emit radiation;
   a light converting structure on which the radiation impinges, the light converting structure configured to convert the radiation to light of a different wavelength; and
   an adhesive layer that bonds the die and the light converting structure together, the adhesive layer having at least three regions, each region having a material characteristic dependent on a position on the die.

2. The light emitting device of claim 1, wherein:
   the material characteristic of the adhesive layer is refractive index, and
   the refractive index varies to provide optical lensing such that changes in the refractive index cause the radiation to be at least one of steered, focused or concentrated in a predetermined direction.

3. The light emitting device of claim 1, further comprising an optical side coat surrounding the die, adhesive layer and light converting structure, wherein the optical side coat is reflective to the radiation.

4. The light emitting device of claim 1, wherein:
   the material characteristic of the adhesive layer is permeability to oxygen, and
   the permeability increases towards a center of the die and decreases towards edges of the die.

5. The light emitting device of claim 1, wherein:
   the material characteristic of the adhesive layer is heat conductivity, and
   the heat conductivity increases towards a center of the adhesive layer.

6. The light emitting device of claim 1, wherein:
   the adhesive layer comprises a plurality of different materials, each in a different region, and
   the material characteristic differs between the different materials.

7. The light emitting device of claim 6, wherein:
   a first of the materials is disposed in a center of the adhesive layer and a second of the materials is disposed in a concentric ring around the center of the adhesive layer.

8. The light emitting device of claim 6, wherein:
   the different materials are arranged in a grid pattern in which at least two of the materials are islands that alternate in each of a pair of substantially orthogonal directions and are surrounded by another of the materials such that the other of the materials is disposed between each adjacent island.

9. The light emitting device of claim 6, wherein:
   the different materials are arranged in a linear pattern in which at least two of the materials each extend in a line in a first direction and alternate in a second direction substantially orthogonal to the first direction, and
   the at least two of the materials are surrounded by another of the materials such that the other of the materials is disposed between each of the at least two of the materials.

10. The light emitting device of claim 9, wherein the linear pattern comprises, for each of the at least two of the materials, at least two of the same material adjacent to each other.

11. The light emitting device of claim 1, wherein the light emitting semiconductor structure is a high power light emitting diode (LED), the material characteristics of the regions disposed to offset a mismatch between a material profile of the high power LED and a material profile of a substantially uniform adhesive layer having a substantially uniform material characteristic independent of a position of the uniform adhesive layer on the die.

12. The light emitting device of claim 1, wherein a region between the light converting structure and the die is devoid of the adhesive layer.

13. The light emitting device of claim 1, further comprising a transition region between adjacent regions having a material characteristic that is substantially uniform, the transition region having a material characteristic intermediate between that of the adjacent regions and a size substantially smaller than that of the adjacent regions.

14. A light emitting device comprising:
   at least one die comprising a light emitting semiconductor structure configured to emit radiation;
   a light converting structure on which the radiation impinges, the light converting structure configured to convert the radiation to light of a different wavelength from a wavelength of the emitted radiation; and
   an adhesive layer that substantially bonds the die and the light converting structure together, the adhesive layer having a material characteristic dependent on a position of the adhesive layer on the die, the material characteristic comprising at least one material characteristic selected from characteristics including refractive index, permeability to oxygen, and heat conductivity.

15. The light emitting device of claim 14, wherein:
   if the material characteristic of the adhesive layer is refractive index, the refractive index is to vary to provide optical lensing such that changes in the refractive index cause the radiation to be steered in a predetermined direction, if the material characteristic of the adhesive layer is permeability to oxygen, the permeability is to increase towards a center of the die and decrease towards edges of the die, and if the material characteristic of the adhesive layer is heat conductivity, the heat conductivity is to increase towards a center of the adhesive layer and decrease towards edges of the adhesive layer.

16. The light emitting device of claim 14, wherein:

the adhesive layer comprises a plurality of different materials that each covers a different section of the die, the material characteristic differs between the different materials, and one of:

a first of the materials is disposed substantially in an areal center of the adhesive layer and a second of the materials is disposed substantially in a concentric ring around the areal center of the adhesive layer, the different materials are arranged in a grid pattern in which at least two of the materials are islands that alternate in each of a pair of substantially orthogonal directions and are surrounded by another of the materials such that the other of the materials is disposed between each adjacent island, or the different materials are arranged in a substantially linear pattern in which at least two of the materials each extend generally in a line in a first direction and alternate in a second direction substantially orthogonal to the first direction, and the at least two of the materials are surrounded by another of the materials such that the other of the materials is disposed between each of the at least two of the materials.

17. The light emitting device of claim 14, wherein the light emitting semiconductor structure is a high power light emitting diode (LED), the material characteristics of the regions disposed to offset a mismatch between a material profile of the high power LED and a material profile of a uniform adhesive layer having a uniform material characteristic independent on a position of the uniform adhesive layer on the die.

18. The light emitting device of claim 14, wherein a region between the light converting structure and the die is devoid of the adhesive layer.

19. The light emitting device of claim 14, further comprising a transition region between adjacent regions having a material characteristic that is substantially uniform, the transition region having a material characteristic intermediate between that of the adjacent regions and a size substantially smaller than that of the adjacent regions.

* * * * *